US006624011B1

(12) United States Patent
Subramanian et al.

(10) Patent No.: US 6,624,011 B1
(45) Date of Patent: Sep. 23, 2003

(54) THERMAL PROCESSING FOR THREE DIMENSIONAL CIRCUITS

(75) Inventors: Vivek Subramanian, Redwood City, CA (US); James M. Cleeves, Redwood City, CA (US); N. Johan Knall, Sunnyvale, CA (US); Calvin K. Li, Fremont, CA (US); Michael A. Vyvoda, Fremont, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 33 days.

(21) Appl. No.: 09/639,750

(22) Filed: Aug. 14, 2000

(51) Int. Cl.$^7$ ............................................. H01L 21/00
(52) U.S. Cl. ........................................................ 438/152
(58) Field of Search ............................ 257/539; 438/14, 438/152, 200; 427/34; 204/192.17

(56) References Cited

U.S. PATENT DOCUMENTS

| 4,654,224 | A | * | 3/1987 | Allred | 427/34 |
| 5,888,853 | A | * | 3/1999 | Gardner | 438/152 |
| 6,069,398 | A | * | 5/2000 | Kadosh | 257/538 |
| 6,217,721 | B1 | * | 4/2001 | Xu | |

* cited by examiner

*Primary Examiner*—John F. Niebling
*Assistant Examiner*—Andre C Stevenson
(74) *Attorney, Agent, or Firm*—Blakely Sokoloff Taylor & Zafman LLP

(57) ABSTRACT

Postponing at least some thermal processing operations, as multiple levels of a three dimensional circuit are formed.

26 Claims, 3 Drawing Sheets

THERMAL PROCESSING FOR THREE DIMENSIONAL CIRCUITS

RELATED APPLICATIONS

Other commonly assigned applications being filed with this application are U.S. patent application Ser. No. 09/639,702, titled "Two-Terminal Device Using Three Dimensional Array"; U.S. patent application Ser. No. 09/639,749, titled "Three Terminal Stackable Memory Device and Method of Fabrication"; U.S. patent application Ser. No. 09/639,577, titled "Multigate Semiconductor Device with Vertical Channel Current and Method of Fabrication"; and U.S. patent application Ser. No. 09/639,579, titled "Charge Trapping Memory and Method of Fabrication" which are incorporated by reference.

BACKGROUND OF THE INVENTION

FIELD OF THE INVENTION

The invention relates to three-dimensional circuits and more particularly to the formation of three-dimensional circuits.

BACKGROUND

Commonly-owned U.S. Pat. No. 6,034,882, titled "Vertically Stacked Field Programmable Nonvolatile Memory and Method of Fabrication" describes, in one aspect, a three-dimensional memory circuit array such as a field programmable, nonvolatile memory array, wherein memory cells are fabricated in a vertical arrangement over rather than in a surface of a planar substrate. The substrate may be, for example, a semiconductor substrate, with decoders and input/output (I/O) circuitry formed either in the substrate or in thin film transistors above the substrate. The memory array is stacked vertically in numerous layers to form a cell level. A three-dimensional memory array may have one or more levels of memory cells in the form of pillars separated by signal lines (e.g., word and bit lines) and a level may interact with adjacent levels. The memory array is fabricated sequentially, i.e., level by level. The cell material at a level may consist of a single layer or a plurality of layers. Included in that description is a cell material of a steering element and a state change element connected in series. The steering element generally enhances the flow in one direction while the state change element retains a programmed state.

U.S. Pat. No. 5,835,396 issued to Zhang also describes a three dimensional arrangement of memory elements. In that patent, memory elements are stacked over a substrate with separate metallic select lines addressing memory cells of a level and an interlevel insulating layer covering the select lines between levels. Depending upon the application (e.g., MPROM, EPROM), the memory elements consist of quasi-conduction material of, for example, doped amorphous silicon and metal oxides.

U.S. Pat. No. 4,646,266 issued to Ovshinsky et al. describes a device having programmable cells formed over an insulating substrate in a three dimensional array between orthogonally-configured metal address lines. In one example, the cells are formed sequentially of separate layers of amorphous silicon in a back-to-back PIN diode configuration.

In three dimensional circuits, consistent performance between the individual circuits at different levels is generally desired. Heretofore, the contribution of the thermal budget associated with the fabrication of a three dimensional circuit has not been reported. What is needed are techniques for managing the thermal budget in multiple level arrays.

SUMMARY OF THE INVENTION

This invention is directed to postponing at least some thermal processing operations, as multiple levels of a three dimensional circuit are formed.

Additional features, embodiments, and benefits will be evident in view of the figures and detailed description presented herein.

DETAILED DESCRIPTION OF THE PREFERRED EMBODIMENTS

Figure 1:
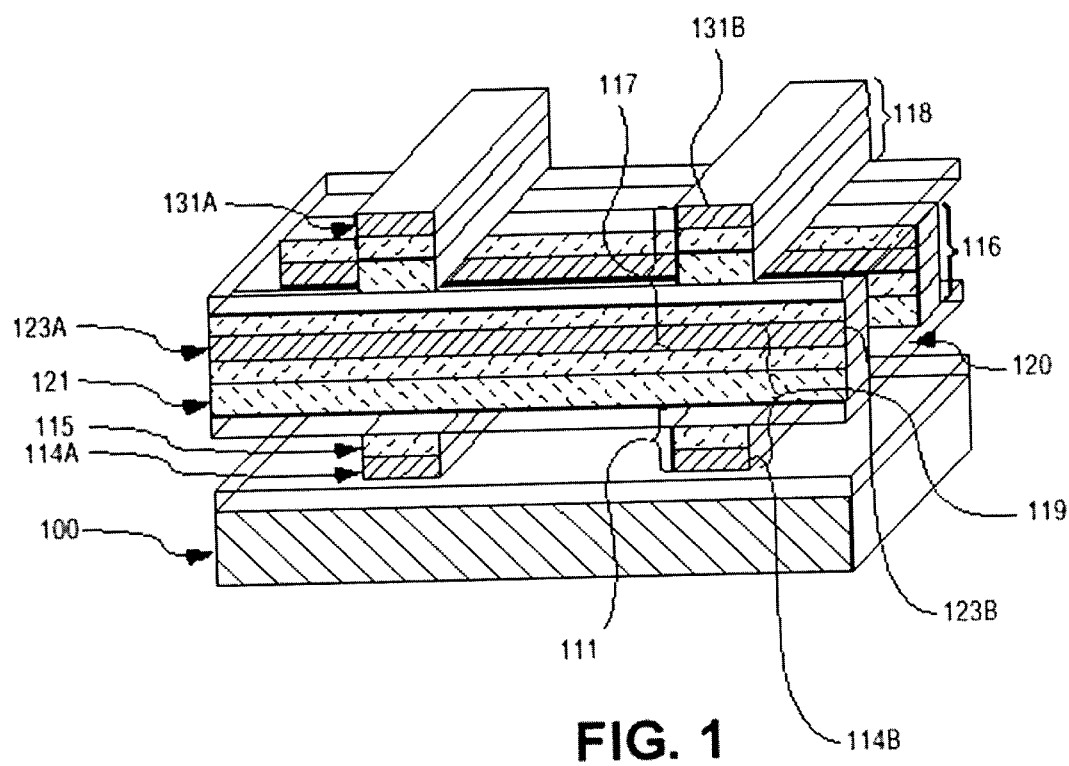
FIG. 1 schematically illustrates a top, side perspective view of a three dimensional memory array fabricated in accordance with an embodiment of the invention.

In a preferred embodiment, the invention relates to managing the thermal budget of three dimensionally-arranged circuit elements, such as memory elements, logic devices or gates, protection, operation, or current control devices, and routing or switching elements. The invention finds particular utility in fabricating three dimensional circuit arrays comprising one or more circuit levels (e.g., memory cells, resistors, and transistors) that are desired to be of similar construction and offer similar performance throughout the array. A circuit level in this context includes a logical unit that could include active devices such as transistors, diodes, thyristors, and quantum dots; passive devices such as resistors, capacitors, fuses, antifuses, and interconnects; or combinations of active and passive devices. Typical circuit formation processes involve introduction (with or without heat) of various materials. Certain of these materials require a thermal processing operation after introduction to modify a material parameter. In the context of three dimensional circuits, regardless of the devices that comprise the circuit, at least some of the thermal processing operations necessary to modify the material(s) are delayed until after the circuit is introduced. In this manner, similar performance and similar construction of the various levels of the circuit may be facilitated. Performance characteristics may include among other considerations resistance, capacitance, and current leakage associated with the circuits that are generally desired to be similar between circuits throughout the array. In some instances, it may be desirable to modify certain circuit levels of an array to be constructed dissimilarly to their counterparts or perform in a dissimilar way. In this sense, the techniques described herein are also applicable to such instances and such modifications.

In the context of this discussion, thermal processing operations affecting material parameter changes may include a low temperature/high duration anneal, a high temperature/low duration anneal, a high temperature/high duration anneal, a low temperature/low duration anneal, or a combination of any of such anneals. In general, anneals for affecting material parameter changes are known in the art. A low temperature/high duration anneal is generally associated with processes seeking a precisely controlled dopant profile or with transforming amorphous silicon to crystalline silicon. A low temperature/high duration anneal generally ranges from room temperature to about 800° C. for durations of 0.5 hours to one week; more preferably, 500–700° C. for durations of two to 48 hours; and even more preferably 550–6500 for four to 24 hours. A high temperature/low duration anneal finds application with controlling dopant profiles at junctions (e.g., transistor junctions). A high temperature/low duration anneal generally ranges from 800 to 1200° C. for up to 30 minutes; more preferably 850 to 1150° C. for five seconds to five minutes, and even more preferably 900 to 1100° C. for 10 seconds to two minutes. A high temperature/high duration anneal finds application in the formation of graded junctions for example in power devices designed to handle high currents and/or voltages. A high temperature/high duration anneal generally ranges from 800 to 1200° C. for a duration of 0.5 hours to one week; more preferably 850 to 1150° C. for two to 48 hours; and even more preferably 900 to 1100° C. for four to 24 hours. A low temperature/low duration anneal finds application in limited reaction silicidation where a silicide is formed but not over-formed to prevent bridging with adjacent structures. A low temperature/low duration anneal generally ranges from room temperature to about 800° C. for durations up to 30 minutes; more preferably 500–700° C. for five seconds to five minutes, and even more preferably 550–650° C. for 10 seconds to two minutes. A combination of, for example, a low temperature/high duration followed by a high temperature/low duration anneal may be used to crystallize a semiconductor material and transform any crystallization defects, respectively.

One example of a three-dimensional circuit is a three-dimensional memory circuit array. Typically, such a structure includes a substrate and a three-dimensional circuit formed over the substrate. The substrate may contain additional circuitry or may provide physical support for the overlying three-dimensional circuit structure. U.S. Pat. No. 6,034,882 issued to Johnson, et al.; U.S. Pat. No. 5,835,396 issued to Zhang; and U.S. Pat. No. 4,646,266 issued to Ovshinsky, et al. are examples of three dimensional memory circuit arrays.

Generally speaking, each of the above examples of three-dimensional circuits may be formed by the introduction and patterning of thermally sensitive material over a substrate. Many materials require thermal processing, a thermal budget, to affect a parameter change of the material. Thermal budget in this context is generally a function of temperature integrated over time. Such material parameter changes include crystal growth, grain growth, dopant diffusion or activation, oxidation, and defect annealing.

FIG. 1 shows a three dimensional memory circuit array over substrate 100 that has two circuit levels (n=2) denoted by brackets 117 and 119. The array is similar to one described in U.S. patent application Ser. No. 09/560,626, titled "Three-Dimensional Memory Array Method of Fabrication," incorporated herein by reference. A second three dimensional memory circuit array is described in U.S. Pat. No. 6,034,882, also incorporated herein by reference.

Referring to FIG. 1, circuit levels of the array are defined by, in this example, rail-stacks 116 orthogonally oriented between half rail-stacks 111 and 118. A bit is stored at the intersection of rail-stacks. A bit is addressed by conductor or signal lines (e.g., conductor or signal lines 114A, 114B, 123A, 123B, 131A, and 131B). In one example, a memory cell comprises a steering element of a diode. In FIG. 1, one steering element may be identified by material layers 115 and 121 separated by insulator layer 120, between, for example, conductors or signal lines 114A and 123A. A cell at level 119 is programmed by selectively breaching insulator layer 120 by passing a current between, for example, conductors or signal lines 114A and 123A.

The cells of, for example, first circuit level 105 and second circuit level 125 may comprise materials that require thermal processing to affect the property of the material. For example, the conductors or signal lines may be a refractory metal silicide that generally requires thermal processing to change the phase of the material from a high resistivity phase to a desired low resistivity phase. Likewise, a diode of a memory cell may comprise a semiconductor material (e.g., material 115, 121) such as silicon that may be deposited in a first ordered state, such as an amorphous state or microcrystalline state and then at some later instance subjected to a thermal processing operation to change the material parameter of ordered state to a second, crystallized ordered state, such as single crystalline or polycrystalline silicon. The diode may also include doped material such as a semiconductor material with a P- or N-type dopant profile. Generally, thermal processing is utilized to diffuse or activate the dopant within the material.

Collectively, there can be a number of thermal processing operations to achieve a structure having desired material parameter(s) on a single level of a memory circuit (e.g., memory array). When multiple levels are involved, as in the structure of FIG. 1, there may be one or more such thermal processing operations associated with each level. If the thermal processing were to be carried out in the course of manufacturing each level without regard to the effects on each level of the thermal processing of successive levels, the material parameter(s) of earlier formed levels would differ from those of later formed levels. Accordingly, at least some of the thermal processing is delayed until after the introduction of multiple levels. One preferred embodiment contemplates, in one aspect, that the majority of the thermal processing be delayed until after all or substantially all of the three-dimensional circuit is introduced. For example, if the three-dimensional circuit includes a level of memory cells, where more than one of the materials comprising the memory cells requires at least one thermal processing operation affecting change(s) to parameter(s) of the material, the processing operations are delayed until the memory cells are introduced. Similarly, if there are two memory cell levels including, for example, three conductors or signal lines, the thermal processing to affect the material parameter(s) change at the different levels is delayed until after the introduction of the two levels. Modifications to this method are also contemplated. For example, a portion of the thermal processing required to affect material parameter changes may be implemented prior to the introduction of all levels of the array to affect certain material parameter changes, such as oxidation or stress reduction, while delaying the effect of the majority of the parameter changes due to thermal processing operations until after the introduction of several or all levels of the circuit.

Figure 2:
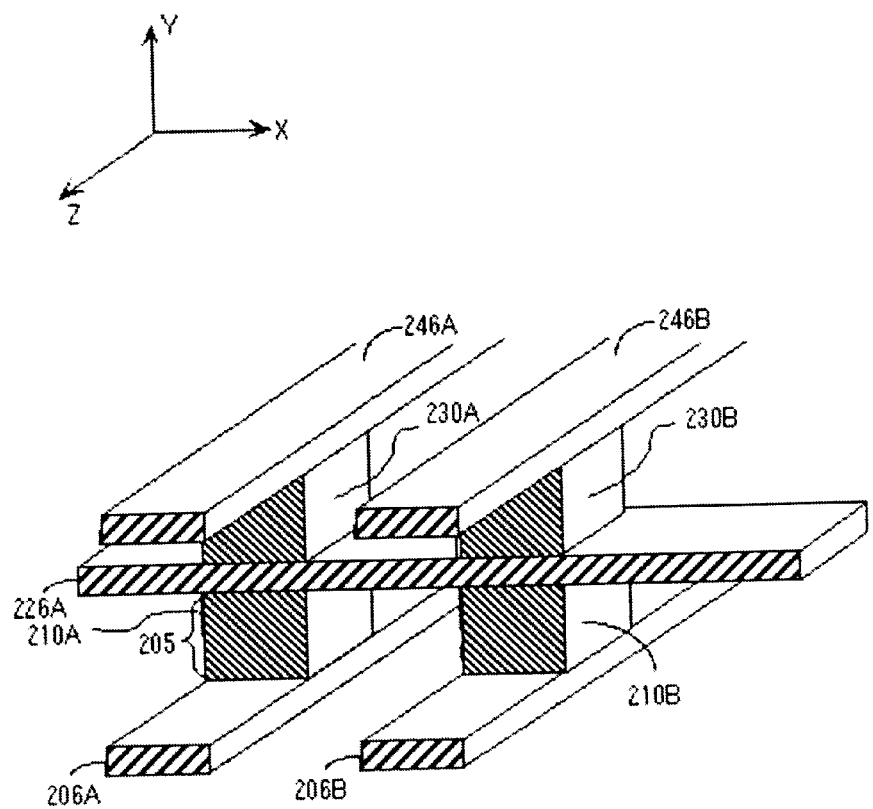
FIG. 2 schematically illustrates a top, side perspective view of a three dimensional resistor array fabricated in accordance with an embodiment of the invention.

A second three-dimensional circuit is a resistor array. A resistor array may be formed by one or more levels of horizontal and vertical interconnects connecting one or more levels of resistors. FIG. 2 illustrates a schematic view of a representative resistor array. In one example, the vertical (e.g., y-direction) levels are introduced sequentially to form, in this example, two circuit levels 205 and 225 (n=2) between three orthogonally-aligned conductors 206A, 206B; 226A, 226B; and 246A, 246B. It is to be appreciated that, depending upon the application of the resistor array, the number and interconnection of resistor levels will vary for purposes of the invention. The resistor array may be formed according to techniques described in, for example, commonly-assigned U.S. patent application Ser. No. 09/560,626, titled "Three-Dimensional Memory Array Method of Fabrication," and U.S. Pat. No. 6,034,882, substituting the elements of the memory cells in that patent, with elements of resistor cells. In this example, the resistor cells (cell levels 205 and 225) may comprise only one material, such as doped or undoped semiconductor material, silicided refractory metals, or other materials apparent to those of skill in the art. In FIG. 2, cell level 205 comprises resistors 210A and 210B of, for example, doped polysilicon between conductors or signal lines 206A and 206B and 226A and 226B of, for example, a refractory metal silicide.

According to an aspect of the invention, some or all of the thermal processing associated with affecting material parameter changes of the resistor levels is delayed in this example, until multiple levels are introduced. For example, where the resistors are silicon material, each level of resistors may be introduced as amorphous silicon and the thermal budget associated with grain growth of amorphous silicon to polycrystalline silicon (e.g., resistors 210A, 210B, 230A, 230B) is delayed until the resistor array is introduced (e.g., in this example, until the two levels of resistors and their corresponding conductors or signal lines are introduced). Similarly, the thermal processing typically associated with diffusing and/or activating doped amorphous or polycrystalline silicon is delayed until the resistor array is introduced; likewise with the phase change of refractory metal silicide conductors or signal lines.

Figure 3:
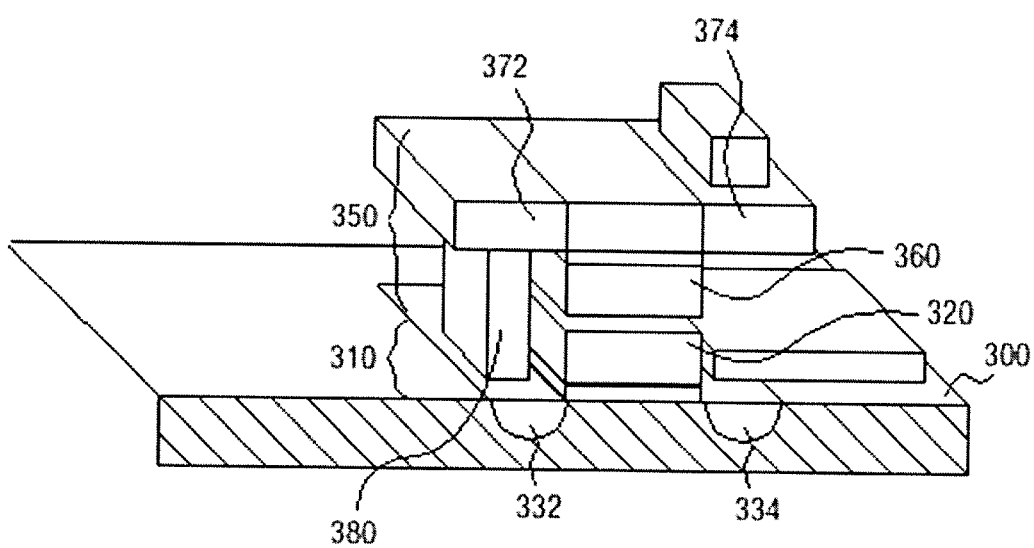
FIG. 3 schematically illustrates a top, side perspective view of a three dimensional transistor circuit fabricated in accordance with an embodiment of the invention.

Still another three-dimensional circuit is a three-dimensional transistor array of one or more levels of transistors. For example, multiple levels of horizontal and vertical interconnects may connect multiple levels of transistors above a substrate. The various multiple levels are formed sequentially. The transistors may be thin film transistors formed in amorphous or polycrystalline silicon, silicon-on-insulator (SOI), or metal oxide semiconductor field effect transistors (MOSFETs) formed in single-crystal silicon. Such transistors may be planar or vertical. FIG. 3 shows an example of a three dimensional transistor circuit with one transistor formed over another transistor. Transistor 310 includes a gate electrode 320 formed on substrate 310 and junction regions 332 and 334 formed in substrate 300. Overlying transistor 310 in a mirror image-like alignment is transistor 350 having gate electrode 360 and junction regions 372 and 374. Junction region 332 of first transistor 310 is coupled to junction region 372 of transistor 350 by interconnect 380.

As is evident from the materials described to form a three dimensional transistor circuit, certain materials may require thermal processing to effect the properties of the materials used in the circuit. A preferred embodiment of the invention contemplates that a majority of such thermal processing be delayed until after the whole multi-level array is introduced rather than as a sequential part of the introduction. For example, gate electrodes of transistors of a level may be introduced as amorphous semiconductor material (e.g., amorphous silicon) and the thermal processing associated with changing amorphous silicon to, for example, polycrystalline silicon is delayed until the transistor array is introduced (e.g., until more than one level of transistors is introduced). Similar delays may be associated with the introduction and transformation of the transistor channels and junction regions (e.g., crystallization, dopant diffusion and activation, etc.).

In the implementations described above, three-dimensionality is achieved by the sequential and/or simultaneous introduction of various levels of devices, fabricated by plurality of deposition, etch, and other operations apparent to those skilled in the art. Many of these operations expose the substrate and the introduced layers to thermal processing operations that affect the material parameters of the various levels. While three dimensional arrays have been described here in some detail, the invention can be applied to any three dimensional circuit structure regardless of the repeating nature within the level or between levels.

One preferred embodiment recognizes several advantages to delaying the majority of the thermal processing until after the three dimensional circuit is fabricated. First, in terms of crystallizing amorphous or partially crystalline layers, delaying such crystallization until after the circuit is fabricated improves the grain structure similarity in various levels of the circuit and thus the level-to-level device consistency. Maintaining a semiconductor material like silicon in an amorphous form will also suppress rapid diffusion of dopants along grain boundaries that exist in polycrystalline material. Still further, suppressing crystallization until a unit cell is fully patterned may allow crystallization to be initiated from a single interface providing more uniform grain structures in cells.

In addition to advantages associated with crystallization, delaying the majority of the thermal processing until after the three dimensional structure is fabricated also improves the characteristics/properties of doped units. A semiconductor diode might contain a junction made up of N-type and P-type doped material. The dopants in the diode (e.g., arsenic, boron, phosphorous, etc.) will diffuse when subjected to high temperature processing. Such diffusion will lead to changes in the breakdown and conduction characteristics of the diode. By confining the fabrication of a three dimensional circuit such that diodes of various levels all see similar high temperature processing, the performance of the characteristics of the diode may be kept similar. Similar phenomena applies to arrays of resistors where, for example, dopant diffusion determines the resistance property of a semiconductor material. Similar phenomena applies to arrays of transistors, where diffusion of dopants often determine channel lengths and/or threshold voltages.

Still a further advantage to delaying the majority of the, thermal processing until after the three dimensional circuit is fabricated includes the ability to control phase changes. One example is the refractory metal silicide titanium silicide. Titanium silicides generally have two phases, represented by $TiSi_x$: (1) a high resistivity ($TiSi_x$) phase, titanium-rich phase where x is less than 2 and a low resistivity phase ($TiSi_2$), silicon-rich phase where x is equal to 2. The silicon-rich phase itself generally has two configurations: C49 and C54. For high performance silicides, the C54 configuration is generally desired. By delaying the thermal budget at an elevated temperature until after each level of titanium silicide is introduced, consistent resistivity values between titanium silicides may be achieved.

EXAMPLE

Table I presents a detailed description of an embodiment of a method of forming a three dimensional memory array over a substrate. The method of forming a three dimensional memory circuit array presented in Table I may be implemented to form the memory array presented in U.S. Pat. No. 6,034,882, or U.S. patent application Ser. No. 09/560,626, titled "Three Dimensional Memory Array Method of Fabrication. The description in the context of Table I focuses on the materials that form the array and thermal processing techniques associated with the introduction and modifying material parameters of the three dimensional circuit.

TABLE I (1) In a semiconductor substrate, form transistors using conventional processing
(2) Form routing interconnections using metal silicides
(3) Passivate surface with $SiO_2$
(4) Deposit first polysilicon (550° C., few hours)
(5) Deposit titanium (Ti)
(6) Anneal to form $TiSi_2$ (C49) interconnect, RTA1* (600° C./2 min)
(7) Steering element/state change element: Deposit diode (e.g., doped amorphous silicon)/antifuse (e.g., $SiO_2$) layers (550° C., few hours) and pattern as required; repeat blocks (4–7) as required to form multiple levels of cells.
(8) Deposit final passivation oxide
(9) Crystallize (600° C./18 hours)
(10) Defect and C54 Silicide RTA2* Anneal (800° C./30 sec)
(11) Form contacts and top metal interconnections

*RTA means rapid thermal anneal

In the example illustrated in Table I, the majority of the thermal processing operations needed to affect material parameter changes, particularly of the conductor or signal lines (representatively formed at blocks (4)–(6)) and steering elements (representatively formed at block (7)) are performed after the three dimensional circuit is formed, i.e., at block (9) (crystallization) and block (10) (RTA2 Anneal).

Numerically, many parameters of interest show an exponential dependence on temperature such that a change in their characteristics may be represented according to the general formula, $\exp(-Ea/kT)$, wherein Ea is some activation energy, k is Boltzmann's constant and T is the absolute temperature. Diffusion of dopants within a semiconductor material and crystallization of a semiconductor material both show such a dependence. In reference to the method described in Table I, it is possible to calculate the effect of the various thermal cycles on material parameters. According to an embodiment of the invention, the cycles are chosen such that the majority of thermal processing is performed after the majority of the three dimensional circuit is fabricated. For example, if the diffusion of phosphorous is considered:

Diffusion as a function of temperature, $D(T)-D_0 \exp(-Ea/kT)$ where $D_0 = 3.85$ cm$^2$/s Ea=3.66 eV.

Assuming eight hours for total deposition time at 550° C., and all other parameters as defined within Table I, for an eight level circuit:

$D(550° C.) = 5.40 \times 10^{-22}$ cm$^2$/s $D(600° C.) = 8.78 \times 10^{-21}$ cm$^2$/s $D(800° C.) = 4.57 \times 10^{17}$ cm$^2$/s The respective diffusion length is determined by multiplying the diffusion values by time and taking the square root of the result:

For depositions per level: $3.94 \times 10^{-9}$ cm

For C49 Anneal, RTA1, per level: $1.03 \times 10^{-9}$ cm

For crystallization anneal at end: $2.39 \times 10^{-8}$ cm

For C54 Anneal, RTA2, at end: $3.70 \times 10^{-8}$ cm

Therefore, for an eight-level circuit, the end-step anneals (e.g., crystallization and RTA2) are approximately 66 percent of the total thermal cycling, and hence are an arithmetic majority. In practice, many parameters, such as oxidation, crystallization and dopant diffusion are self-limiting, in that they do not continue at the same rate past a certain point. In these cases, "majority" may be operationally defined such that the end result is essentially the same across layers, since the end-step anneals are used to bring parameters for all levels into the self-limiting stage, where they converge towards similar values.

Saving the majority of the thermal processing until the three dimensional circuit is introduced and patterned serves to maintain the consistency of performance of the individual elements (e.g., memory cells) of the circuit. Since, in the case of a sequentially formed three dimensional circuit array, the introduction and patterning follow a predominantly sequential formation where similar operations are repeated with each level of the circuit, delaying a majority of the thermal processing until after the array is fabricated avoids lower levels of the array being exposed to a greater thermal budget than the higher levels of the array. Therefore the behavior of the lower level circuits (e.g., memory cells), where desired, may be made to perform similarly to the performance of the upper level circuits.

In the method presented in Table I, the thermal processing changes amorphous silicon into silicon grain, either polysilicon or single crystalline silicon. Grain growth or nucleation generally organizes atoms around a single grain to create the single crystalline silicon or polysilicon structure. Nucleation or grain growth takes place predominantly at the signal lines/silicon interface. In other words, a silicon grain at a signal line/silicon interface tends to grow out from that interface. As a grain is nucleated within, for example, a pillar of a memory cell described in U.S. Pat. No. 6,034,882, the energy of the system favors the grain occupying the entire pillar as the more energetically stable state of structure.

Saving the majority of the thermal processing until after the three dimensional circuit has been introduced and patterned provides an additional benefit for grain growth. In the case of memory cell pillars such as described in U.S. Pat. No. 6,034,882, the delayed thermal processing to increase grain growth can exploit the surface free energy of the pillars of, for example, the steering element of the memory cells. Just as it has been determined that grain growth is favored at the signal line/silicon interface, it has also been determined that grain growth is not favored on the side walls of a pillar. Thus, since the pillars are pre-patterned prior to significant grain growth, such growth proceeds from the signal line/silicon interface and not from the sides of the pillars. In the case of a memory cell, by choosing a state change element of a material that inhibits nucleation or grain growth, the grain growth is limited to proceeding from the signal line/silicon interface and therefore grain growth of a single grain or a multiple grain structure can be optimized. A suitable state change element material that inhibits grain growth is a dielectric material such as $SiO_2$.

In general, there are two ranges of nucleation or grain growth desirable for consistent performance of silicon-based circuit structures, such as silicon-based memory cells (e.g., steering elements). Ideally, particularly as circuit structures get smaller, e.g., smaller than 0.25 micron feature sizes, a circuit device such as a steering element of a memory cell can be formed with a single grain grown from amorphous silicon as described above. In this manner, in the case of a three dimensional circuit array, all circuits formed of a single grain will perform in a similar manner. Alternatively, multiple grain structures having an optimized number of similar grains will also perform similarly. For example, steering elements each having a known grain count (e.g., 8–10 grains) will statistically perform similarly. By optimizing the thermal budget associated with grain growth, circuit structures having similar grain counts can be fabricated. Such structures can be viewed experimentally, for example, through x-ray diffraction or transmission election microscopy (TEM), to examine the grain growth and optimize the thermal budget associated with grain growth.

With respect to activation and diffusion of dopants, delaying the majority of the thermal processing associated with the fabrication of a three dimensional circuit structure utilizing doped circuit materials until after the circuit is introduced, supports an objective that similarly doped elements will tend to behave in a similar manner. It has been determined, for example, that dopants within a semiconductor material tend to move (e.g., diffuse) on exposure to high temperatures. Therefore if, for example, the lower levels of a memory array are exposed to a greater thermal budget than higher levels, more dopant diffusion can be expected in the lower levels of the array. The increased diffusion changes the electrical characteristics in the lower levels. By delaying dopant activation until each level of memory cells is introduced and fabricated, the process of the invention contemplates that the diffusion among doped elements is similar and thus electrical characteristics of similar materials in the same or different levels will likewise be similar.

Still further, by limiting the thermal processing during introduction and fabrication, the distance that dopants within a structure (e.g., a PN diode steering element) can diffuse is limited. Therefore, by keeping the thermal budget lower during introduction and patterning of the structures, the process of the invention reduces the possibility of the dopants shorting a circuit element. Thus, doped structures according to the invention can be fabricated according to smaller feature size design specifications than their prior art counterparts.

In the above description of an embodiment of forming a three dimensional memory structure over a substrate, the refractory metal silicide of the conductors or signal lines is retained in a high resistivity phase until after introduction and patterning of the entire memory structure. In this manner, the thermal processing used to convert the refractory metal silicide to a low resistivity phase is delayed until after the introduction and patterning of the entire memory structure. Alternatively, a second embodiment of a fabrication technique changes the refractory metal silicide from a high resistivity phase to a low resistivity phase as the structure is introduced and patterned.

Other material parameters that are affected by thermal processing include, but are not limited to, electrical parameters such as resistivity, semiconductor versus conductor characteristics, diode leakage, diode breakdown voltage, on/off, ratios, and transconductance; optical parameters such as reflectivity, absorption, complex refractive index, and polarization; thermal properties, such as conductivity, phase of material, and heat capacity; magnetic properties, such as permitivity, permeance, and hysterisis; and mechanical properties, such as stress, strength, and elasticity.

Although one objective of the invention is to keep the thermal budget associated with introduction and patterning of the three dimensional structure relatively low, such objective may be maintained despite changing the phase of the silicide material as such change is accomplished at a relatively low thermal budget given the thermal budget associated with fabricating the overall structure. In one example, the thermal budget utilized for the phase change of silicide conductors or signal lines is a temperature of approximately 700° C. for approximately 60 minutes. By inhibiting oxide formation over the high resistivity phase silicide (e.g., a native oxide), the thermal budget associated with the transformation may be further reduced.

One reason that it would be desired to change levels of conductor or signal line material to the low resistivity silicide material during introduction and patterning is that such change may tend to relieve stress in the overall structure that may accumulate while introducing and patterning multiple level structures.

In the preceding detailed description, a method of fabricating a three dimensional circuit structure has been disclosed with improved properties. Such fabrication techniques that yield an improved circuit include, but are not limited to, fabricating a structure that contemplates a significant thermal budget associated with modifying the properties of certain materials of the structure and delaying some or the majority of that thermal budget until the structure has been introduced.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
   over a substrate, introducing a circuit comprising n circuit levels, wherein n is greater than one, and more than one of the levels requires a thermal processing operation having a thermal budget, $D_L$, associated with a material parameter of the level,
   wherein, after introduction, the material parameter of the First level is changed by a thermal budget, $D_O$, that is less than $$\sum_{L=1}^{L=n-1} D_L.$$

2. The method of claim 1, wherein introducing comprises subjecting the three dimensional circuit to a thermal processing operation having the thermal budget, $D_O$, after the introduction of the n circuit levels.

3. The method of claim 2, wherein the introduction of each circuit level comprises thermal processing operations and Do is greater than a budget for the thermal processing operations to introduce each circuit level.

4. The method of claim 1, wherein the thermal processing associated with the thermal budget, $D_O$, comprises a low temperature/high duration anneal.

5. The method of claim 1, wherein the thermal processing associated with the thermal budget, $D_O$, comprises a high temperature/high duration anneal.

6. The method of claim 1, wherein the thermal processing associated with the thermal budget, $D_O$, comprises a low temperature/low duration anneal.

7. The method of claim 1, wherein the thermal processing associated with the thermal budget, $D_O$, comprises a high temperature/low duration anneal.

8. The method of claim 1, wherein the thermal processing associated with the thermal budget, $D_O$, comprises a low temperature/high duration anneal followed by a high temperature/low duration anneal.

9. The method of claim 1, wherein introducing comprises introducing a circuit comprising n circuit levels each comprising a similar circuit device.

10. A method comprising:
   forming a circuit comprising a plurality of circuit levels, each of the circuit levels requiring a thermal processing operation; and
   delaying at least a portion of thermal processing for each of the plurality of circuit levels;

following formation of the plurality of circuit levels, performing at least the portion of the thermal processing for each of the plurality of circuit levels, whereby the each of the plurality of circuit levels has substantially similar material parameters.

11. The method of claim 10, wherein the introduction of each circuit level comprises thermal processing operations and the thermal processing following formation of the plurality of circuit levels is greater than the thermal processing to introduce each circuit level.

12. The method of claim 10, wherein the thermal processing following formation of the plurality of circuit levels comprises a low temperature/high duration anneal.

13. The method of claim 10, wherein the thermal processing following formation of the plurality of circuit levels comprises a high temperature/high duration anneal.

14. The method of claim 10, wherein the thermal processing following formation of the plurality of circuit levels comprises a low temperature/low duration anneal.

15. The method of claim 10, wherein the thermal processing following formation of the plurality of circuit levels comprises a high temperature/low duration anneal.

16. The method of claim 10, wherein the thermal processing following formation of the plurality of circuit levels comprises a low temperature/high duration anneal followed by a high temperature/low duration anneal.

17. The method of claim 10, wherein forming a circuit comprises forming a circuit comprising more than one circuit level each level comprising a similar circuit device.

18. A method comprising:

forming a circuit comprising a plurality of circuit levels, each circuit level comprising a semiconductor material; and delaying a majority of thermal processing to modify a material parameter of the plurality of circuit levels until after a majority of the plurality of circuit levels are formed.

19. The method of claim 18, wherein the material parameter is one of crystal growth and grain growth, and modifying comprises a low temperature/high duration annealing.

20. The method of claim 18, wherein the material parameter comprises dopant diffusion, and modifying comprises a high temperature/low duration annealing.

21. The method of claim 18, wherein forming a circuit further comprises forming signal lines of a refractory metal silicide associated with each circuit level and modifying further comprises modifying a resistivity of the refractory metal silicide from a first value to a different second value.

22. The method of claim 18, wherein the material parameter comprises resistivity.

23. The method of claim 18, wherein the material parameter comprises diode leakage.

24. The method of claim 18, wherein the material parameter comprises crystal growth.

25. The method of claim 18, wherein the material parameter comprises grain growth.

26. The method of claim 18, wherein the material parameter comprises dopant diffusion.

* * * * *